United States Patent
Yeh et al.

(10) Patent No.: US 7,169,701 B2
(45) Date of Patent: Jan. 30, 2007

(54) DUAL DAMASCENE TRENCH FORMATION TO AVOID LOW-K DIELECTRIC DAMAGE

(75) Inventors: Chen-Nan Yeh, Taipei (TW); Tsiao-Chen Wu, Hsinchu County (TW); Chao-Cheng Chen, Shin-chu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 253 days.

(21) Appl. No.: 10/882,058

(22) Filed: Jun. 30, 2004

(65) Prior Publication Data

US 2006/0003576 A1   Jan. 5, 2006

(51) Int. Cl.
*H01L 21/4763* (2006.01)

(52) U.S. Cl. ............... 438/638; 438/633; 438/637; 438/780; 257/E21.579; 257/E21.024

(58) Field of Classification Search ......... 438/633, 438/636, 637, 638; 257/E21.579, E21.054
See application file for complete search history.

(56) References Cited

U.S. PATENT DOCUMENTS

| 6,924,221 B2* | 8/2005 | Shen ................... 438/618 |
| 2004/0002210 A1* | 1/2004 | Goldberg et al. ......... 438/637 |
| 2004/0018721 A1* | 1/2004 | Kim et al. .............. 438/637 |
| 2004/0175934 A1* | 9/2004 | America et al. ......... 438/638 |
| 2005/0106856 A1* | 5/2005 | Chen et al. ............. 438/633 |

* cited by examiner

*Primary Examiner*—Michelle Estrada
(74) *Attorney, Agent, or Firm*—Tung & Associates

(57) ABSTRACT

A method for forming a dual damascene including providing a first dielectric insulating layer including a via opening; forming an organic dielectric layer over the first IMD layer to include filling the via opening; forming a hardmask layer over the organic dielectric layer; photolithographically patterning and dry etching the hardmask layer and organic dielectric layer to leave a dummy portion overlying the via opening; forming an oxide liner over the dummy portion; forming a second dielectric insulating layer over the oxide liner to surround the dummy portion; planarizing the second dielectric insulating layer to expose the upper portion of the dummy portion; and, removing the organic dielectric layer to form a dual damascene opening including the oxide liner lining trench line portion sidewalls.

26 Claims, 3 Drawing Sheets

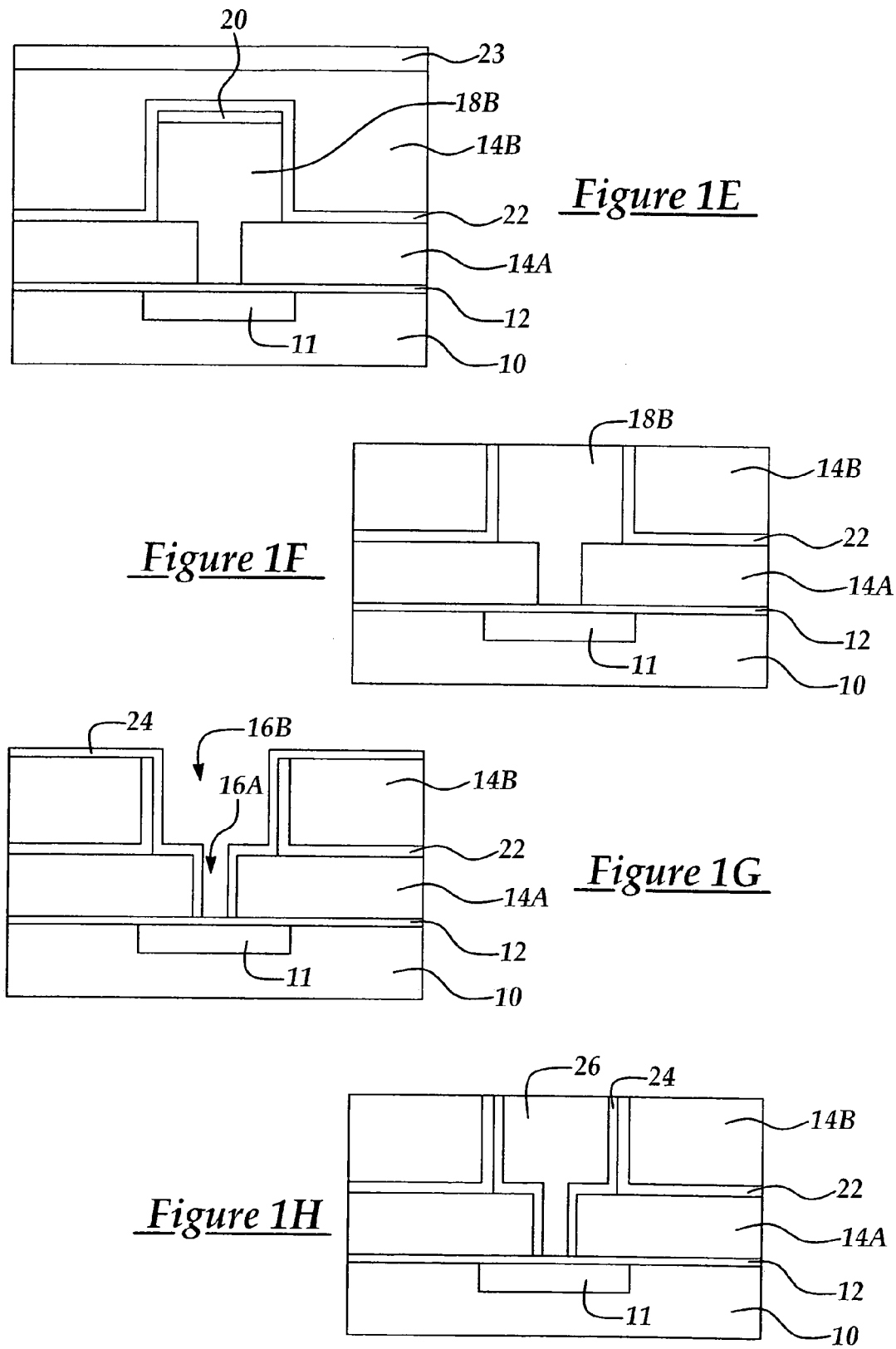

DUAL DAMASCENE TRENCH FORMATION TO AVOID LOW-K DIELECTRIC DAMAGE

FIELD OF THE INVENTION

This invention generally relates to semiconductor device manufacturing methods and more particularly to a method for forming dual damascene structures without damaging or compromising low-K porous dielectric IMD layers and improving barrier layer adhesion.

BACKGROUND OF THE INVENTION

In forming damascene structures in integrated circuit manufacturing processes, the surface condition of the damascene opening is critical for achieving acceptable adhesion and coverage of overlying layers. For example, a dual damascene opening is formed in an inter-metal dielectric (IMD) insulating layer in a series of photolithographic patterning and etching processes, followed by formation of a barrier layer and a metal filling process.

Increasingly, low-K layers are required to reduce signal delay and power loss effects as integrated circuit devices are scaled down. One way this has been accomplished has been to introduce porosity or dopants into the dielectric insulating layer.

As a result, the need for lower dielectric constant materials has resulted in the development of several different types of organic and inorganic low-k materials. In particular, incorporation of low-K materials with dielectric constants less than about 3.0 has become standard practice as semiconductor feature sizes have diminished to less than 0.13 microns. As feature sizes decrease below 0.13 microns, for example to 65 nm and below, materials with dielectric constants less than about 2.5 are required. Several different organic and inorganic low-k materials have been developed and proposed for use in semiconductor devices as insulating material having dielectric constants between about 2.2 and about 3.0.

For example, porous silicon oxide based materials are formed by including a carbon based moiety which forms an Si—O—C type structures which forms a porous structure following deposition and curing or treatment processes. In prior art processes the entire IMD layer has been deposited in a single step process where the entire IMD layer has about the same density or porosity volume throughout the IMD layer.

One problem with using porous low-K IMD materials has been the difficulty of adapting conventional plasma assisted etching processes to reliably and consistently etch openings with acceptable profiles in a low-K IMD layer. The selectivity of plasma etching including the anisotropicity of the etching process becomes more complex as more porosity is introduced into the IMD layer to achieve lower dielectric constants.

For example, etching of the trench portion of a dual damascene opening is critical to overall reliability and performance of the dual damascene structure. Frequently in etching a trench opening overlying one or more vias, the trench structure is patterned directly onto a trench low-K IMD layer frequently resulting less than satisfactory trench etching profiles, for example resulting in a roughened bottom trench portion.

In addition, wet chemical cleaning processes and oxygen ashing processes used in prior art processes to remove sacrificial filling layers protecting the via opening sidewalls exposing the porous low-K IMD layer frequently has a detrimental effect on low-K silicon oxide based (porous) IMD layers, undesirably increasing the dielectric constant following such processes. Other problems with forming dual damascenes in low-K silicon oxide based (porous) IMD layers include photoresist poisoning which is believed to be caused by the absorption and re-emission of photoresist poisoning nitrogen species frequently present from the formation of nitride layers e.g., etch stop layers.

Yet another problem related to forming etched openings in low-K porous IMD layers, is the presence of a relatively rough surface due to the penetration of pore openings at the surface of the etched opening. The micro-roughness at the surface adversely affects the adhesion and coverage of overlying deposited layers, for example barrier layers. As a result, thicker barrier layers, with increased series resistance are required in order to avoid forming barrier layers having pinholes which undesirably allow electromigration of metal into the IMD layer. Further, deposition of seed layers may be non-continuously formed, thereby adversely affecting electro-chemical deposition processes. The various problems with low-K porous IMD layers including an etching profile and etched opening surface condition therefore undesirably affects yield and reliability of integrated circuit semiconductor devices.

There is therefore a need in the integrated circuit manufacturing art to develop a manufacturing process whereby dual damascene structures may be formed without encountering the various problems presented by porous low-K dielectric layers including an opening etching profile and surface condition to improve integrated circuit device yield, performance, and reliability.

It is therefore among the objects of the present invention to provide a manufacturing process whereby dual damascene structures may be formed without encountering the various problems presented by porous low-K dielectric layers including an opening etching profile and surface condition to improve integrated circuit device yield, performance, and reliability, while overcoming other shortcomings of the prior art.

SUMMARY OF THE INVENTION

To achieve the foregoing and other objects, and in accordance with the purposes of the present invention, as embodied and broadly described herein, the present invention provides a method for forming a dual damascene structure.

In a first embodiment, the method includes providing a first dielectric insulating layer including a via opening; forming an organic dielectric layer over the first IMD layer to include filling the via opening; forming a hardmask layer over the organic dielectric layer; photolithographically patterning and dry etching the hardmask layer and organic dielectric layer to leave a dummy portion overlying the via opening; forming an oxide liner over the dummy portion; forming a second dielectric insulating layer over the oxide liner to surround the dummy portion; planarizing the second dielectric insulating layer to expose the upper portion of the dummy portion; and, removing the organic dielectric layer to form a dual damascene opening including the oxide liner lining trench line portion sidewalls.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 1A to 1H are cross sectional views of a dual damascene structure at stages of manufacture according to an embodiment of the invention.

DETAILED DESCRIPTION OF THE PREFERRED EMBODIMENTS

Although the method of the present invention is explained with reference to formation of an exemplary copper interconnect structure (feature) such as a dual damascene with characteristic dimensions less that about 0.13 microns, including less than about 65 nm, it will be appreciated that the process may be equally as well used in forming single damascene structures as well as thicker and wider structures such as bonding pads and wide trenches. Further, it will be appreciated that the metal used to fill the metal interconnect may include tungsten, aluminum, copper and alloys thereof, most preferably copper.

In addition, the method is particularly advantageously used with silicon oxide based low-K dielectric insulating layers having an interconnecting porous structure and having a dielectric constant of less than about 3.0 including less than about 2.5, for example from about 2.2 to about 3.0. Further, the term 'copper' will be understood to include copper and alloys thereof.

For example, in an exemplary embodiment, referring to FIGS. 1A–1H, are shown cross sectional views of a portion of a multi-level semiconductor device at stages in an integrated circuit manufacturing process.

Figure 1A:
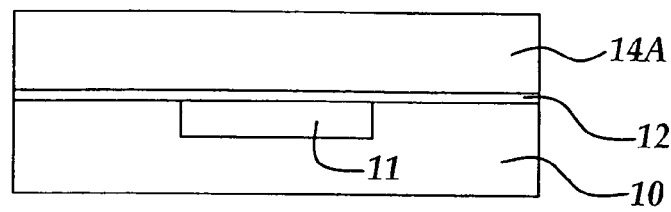

Referring to FIG. 1A, a conductive region 11 is formed in a dielectric insulating layer 10 by conventional processes known in the micro-electronic integrated circuit manufacturing process followed by deposition of an overlying first etching stop layer 12, for example, silicon nitride (e.g., SiN, $Si_3N_4$) or silicon carbide (e.g., SiC) to a thickness of about 300 Angstroms to about 700 Angstroms by a conventional CVD process, for example LPCVD or PECVD.

Still referring to FIG. 1A, formed over first etching stop layer 12 is dielectric insulating (IMD) layer portion 14A, preferably formed of a silicon oxide based low-K material having a porous structure, for example including interconnecting pores. For example, the overall pore volume of the IMD layer portion 14A may be from about 20% to about 60% pore volume with respect to any selected IMD layer volume portion. The dielectric insulating layer portion 14A is preferably carbon doped oxide or organo-silicate glass (OSG) formed by a CVD process, for example an LPCVD or PECVD process. For example, organo-silane precursors such methylsilanes, including tetramethylsilane and trimethylsilane may be used to form the dielectric insulating layer 14A. In addition, organo-siloxane precursors including cyclo-tetra-siloxanes are suitably used to form the IMD layer portion 14A. Preferably the lower IMD layer portion 14A is formed at a thickness sufficient to encompass a via portion of a subsequently formed dual damascene structure, for example from about 1000 Angstroms to about 2700 Angstroms in thickness. It will be appreciated that the IMD layer portion 14A may also be formed of fluorinated silicate glass (FSG). Preferably, the lower IMD layer portion 14A is formed having a dielectric constant between about 2.2 and about 3.2.

Figure 1B:
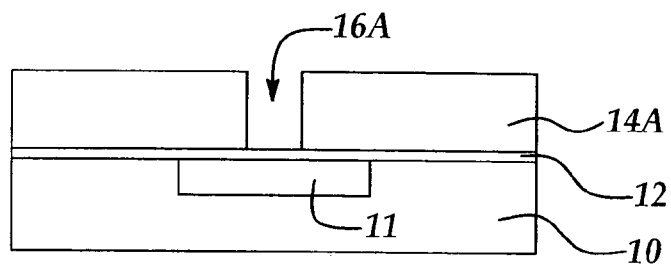

Referring to FIG. 1B, conventional photolithographic patterning and dry (plasma) etching processes are then carried to form via opening 16A. For example, via opening 16A, is formed by conventional photolithographic patterning and reactive ion etch (RIE) processes to stop on the etch stop layer 12.

Figure 1C:
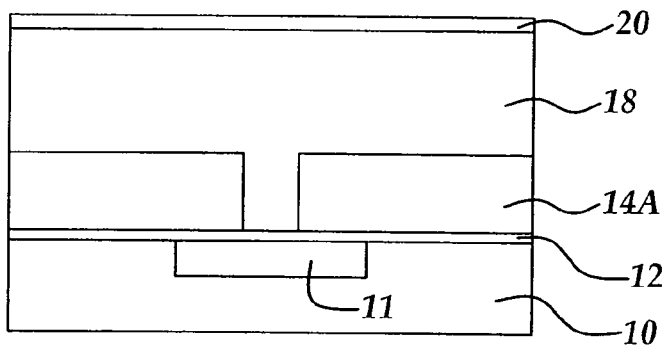

Referring to FIG. 1C, following formation of via opening portion 16A, and removal of the patterned resist layer (not shown) an organic dielectric layer 18 is deposited overlying the IMD layer 14A. The organic dielectric layer 18 may be any organic dielectric, for example a polyimide based organic, or commercially available organic dielectrics such as SILK™ and FLARE™. In addition, it will be appreciated that other organic dielectric materials such as benzocyclobutene, Nautilus™, Teflon™, Parylene-F, amorphous fluorocarbon, and fluorinated polyimide material may be suitably used.

It will be appreciated that the via opening 16A will be filled with the organic dielectric layer 18 in the organic dielectric layer deposition process which may be blanket deposited by a spin-on or PECVD process. Still referring to FIG. 1C, a capping/hardmask layer 20, for example silicon oxycarbide (e.g., SiOC) or silicon oxynitride (e.g., SiON) is then deposited overlying the organic dielectric layer 18 to a thickness of about 300 Angstroms to about 1000 Angstroms. The capping/hardmask layer 20 preferably also functions as an anti-reflective coating (ARC) in a subsequent trench photolithographic patterning process.

Figure 1D:
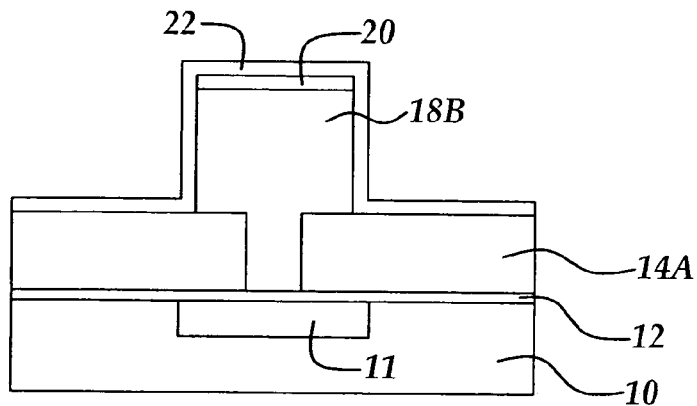

Referring to FIG. 1D, the hardmask layer 20 and organic dielectric layer 18 are then photolithographically patterned and plasma etched by a conventional hardmask layer and organic dielectric layer etching chemistry to form an organic dielectric layer dummy trench portion 18B in the shape and size of a subsequently desired trench opening overlying the backfilled via opening portion 16A. For example, a multi-step dry etching process preferably includes a fluorocarbon etching chemistry such as $CF_4$ to first etch through the hardmask layer 20 followed by a nitrogen containing etching chemistry optionally including $O_2$ or $H_2$, such as $N_2/O_2$, $N_2/H_2$, or $NH_3$ plasma source gases, for dry etching through the organic dielectric layer portion 18 to stop on the low-K dielectric layer portion 14A. Following the dry etching process, remaining resist pattern portions (not shown) are removed by an oxygen ashing and/or wet stripping process. Still Referring to FIG. 1D, the process wafer including dummy trench portion 18B and hardmask layer 20 is then covered by an oxide liner 22, preferably TEOS oxide deposited by an LPCVD or PECVD process to a thickness of about 200 Angstroms to about 1000 Angstroms.

Referring to FIG. 1E, a second IMD layer portion 14B is then deposited over the oxide liner 22. The second IMD layer portion 14B may be the same or different material as IMD layer portion 14A including a different dielectric constant, for example preferably having a lower dielectric constant than IMD layer portion 14A, but within the same range of dielectric constants, preferably from about 2.2 to about 3.2, more preferably less than about 2.7. The second IMD layer portion is preferably formed from the same preferred precursors as the first dielectric layer portion 14A, for example organo-silane or organo-siloxane precursors to form organo silicate glass (OSG) or carbon doped silicon oxide IMD layer 14B. It will be appreciated that IMD layer portions 14A and 14B may also be formed of fluorinated silicate glass (FSG).

Still referring to FIG. 1E, following IMD layer 14B deposition, IMD layer 14B is planarized by a plasma etchback or chemical mechanical polish (CMP) process. Preferably, in the case of a plasma etchback process, a conventional spin-on organic polymer layer e.g., 23 is first deposited overlying the IMD layer 14B to aid in the plasma etchback planarization and reduce damage to the IMD layer 14B.

Referring to FIG. 1F, following the planarization process, the hardmask layer portion 20 and the oxide liner 22 overlying the dummy trench portion 18B is removed to expose the organic dielectric material forming dummy trench portion 18B which is formed about co-planar with adjacent IMD layer 14B portions.

Referring to FIG. 1G, the organic dielectric material filling dummy trench portion 18B and backfilling via opening 16A is then removed. Preferably an oxygen ashing and/or wet etching (stripping) process is used to remove the organic dielectric material to form trench opening 16B overlying and encompassing via opening 16A, both openings together forming a dual damascene opening. It will be appreciated that the trench opening 16B may be formed to encompass one or more via openings. Following removal of the organic dielectric material to form a dual damascene opening, a conventional plasma etch process is carried out to remove etch stop layer 12 at the bottom of the via opening 16A to expose the underlying conductive area 11, for example a copper filled interconnect.

Still referring to FIG. 1G, following dual damascene opening formation, a barrier layer 24 is deposited over the via opening portion including exposed IMD layer 14A along via opening portion 16A and trench opening portion 16B including oxide liner portion 22 lining the trench opening sidewalls. Preferably, the barrier layer 24 is deposited by conventional CVD and/or PVD processes and includes at least one of a refractory metal, refractory metal nitride, or silicided refractory metal nitride layer, for example Ta, Ti, W, TaN, TiN, WN, TaSiN, TiSiN, and WSiN. In a preferred embodiment, for subsequently filling the dual damascene opening with a copper filling, preferably the barrier layer 24 is formed of Ta/TaN, TaN or TaSiN. The barrier layer 24 may advantageously be formed at a lower thickness compared to prior art processes according to the present invention due to the relatively non-porous nature of the oxide liner 22 lining the trench sidewalls. For example, the barrier layer 24 may be deposited at a thickness of between about 50 Angstroms and about 350 Angstroms.

Referring to FIG. 1H, conventional metal filling and planarization processes are then carried out to backfill the damascene opening with a metal layer 26, for example copper, tungsten aluminum, or alloys thereof. In a preferred embodiment, copper or a copper alloy is used to backfill the dual damascene opening. For example, conventional copper deposition processes, for example electro-chemical deposition preceded by deposition of a copper seed layer (not shown) is carried out. Advantageously, the copper seed layer may be advantageously formed more reliably (continuously) without pinholes at a lower thickness according to the present invention due to the improved integrity and coverage of the barrier layer 24. For example, the copper seed layer may be deposited at a thickness of between about 50 Angstroms and about 150 Angstroms.

Still referring to FIG. 1H, in a preferred embodiment, a conventional copper ECD process is first carried out followed by a conventional CMP process to remove the surface portions of copper layer 26 and barrier layer 24 to the IMD layer 14B level to complete the formation of the dual damascene.

A novel method of forming a dual damascene structure has been presented which avoids the various problems presented by dry etching or wet cleaning low-K porous dielectric insulating layers, particularly the trench line portion, which has the most significant impact on device reliability and performance. Advantageously, by patterning the trench line portion on an organic dielectric and depositing an oxide liner, dry etching damage to the trench line sidewalls is avoided, thereby improving etching profiles and avoiding damage to the trench line sidewalls.

The method of formation of the dual damascene structure according to the present invention additionally overcomes the problems of increasing the IMD layer dielectric constant and photoresist poisoning. Moreover, the etchback process using an overlying protective spin-on polymer layer over the second IMD layer reduces etching damage to the uppermost portion of the second IMD layer further improving device performance and reliability. Finally, the formation of the oxide liner along trench line sidewalls allows the formation of a barrier layer with improved integrity, coverage, and adhesion, allowing relatively thinner barrier layers to be deposited thereby further improving device performance and reliability. For example, the benefits of increased signal speed and lower power loss provided by porous low-K IMD layers are maintained while improving interconnect reliability and electrical performance including barrier layer adhesion and reduced electrical resistances as well as reducing defects introduced by non-continuous copper seed layer in a copper electrodeposition process.

Figure 2:
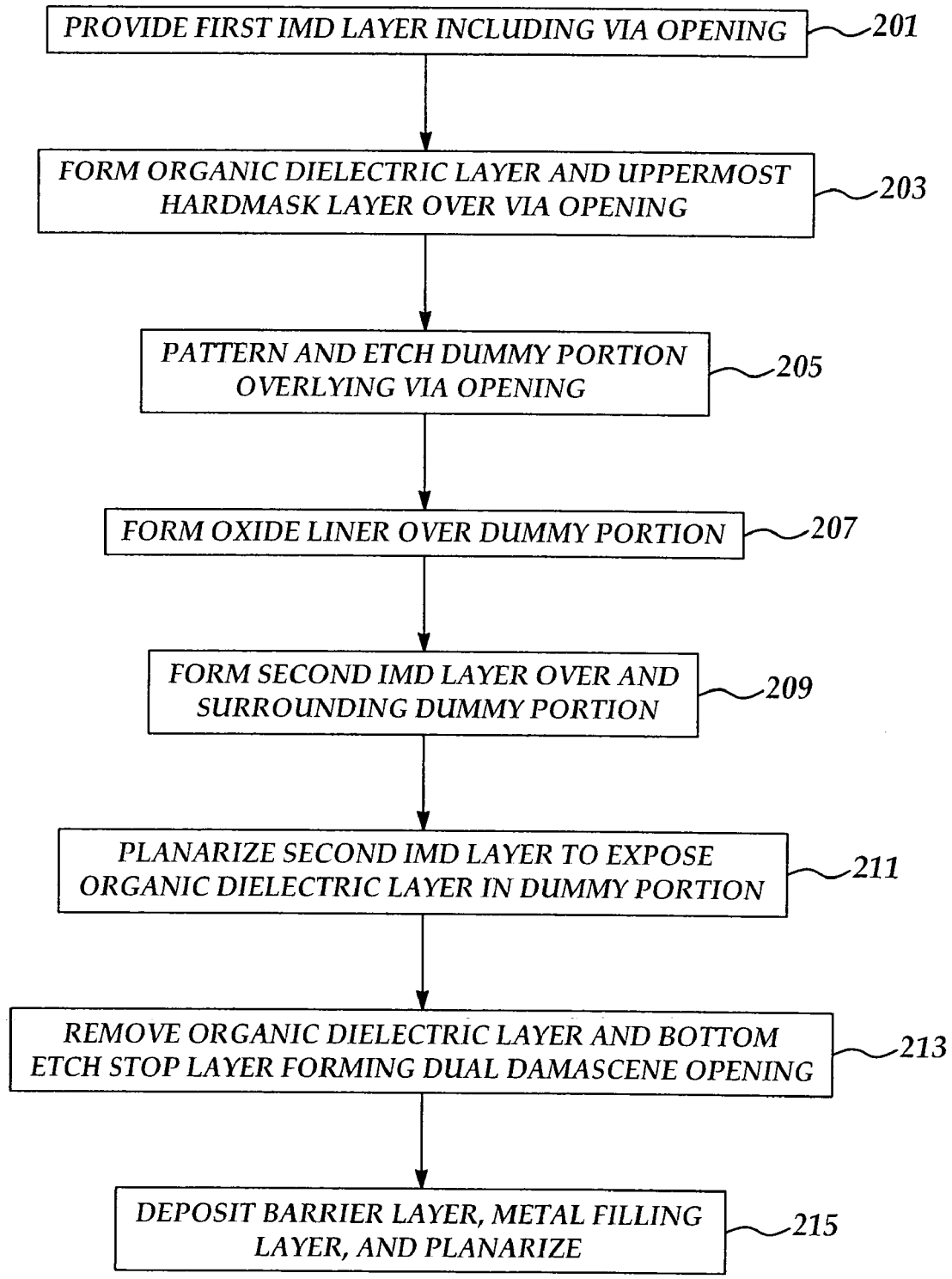
FIG. 2 is a process flow diagram including several embodiments of the present invention.

Referring to FIG. 2 is shown a process flow diagram including several embodiments of the present invention. In process 201, a semiconductor wafer process surface including a conductive area, an overlying etch stop layer a first IMD layer including a via opening contacting the etch stop layer is provided. In process 203, an organic dielectric layer and overlying hardmask layer is deposited over the first IMD layer to include backfilling the via opening with the organic dielectric material. In process 205, the hardmask layer and organic dielectric layer is etched to leave a dummy trench portion overlying the backfilled via opening about the size of a desired subsequently formed trench opening. In process 207, an oxide liner is formed over the dummy trench portion. In process 209, a second IMD layer is deposited over the oxide liner to surround the dummy trench portion. In process 211, the second IMD layer is planarized, to include exposing the organic dielectric material forming the dummy trench portion. In process 213, the organic dielectric material is removed from the via opening portion and the dummy trench portion including removing the bottom etch stop layer forming a dual damascene opening including the oxide liner lining the trench portion sidewalls. In process 215, conventional processes are carried out including barrier layer formation, metal filling, and planarization processes.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a dual damascene comprising the steps of:
   providing a first IMD layer comprising a via opening;
   forming an organic dielectric layer over the first IMD layer to include filling the via opening;
   photolithographically patterning and dry etching the organic dielectric layer to leave a dummy portion overlying the via opening;
   forming an oxide liner over the dummy portion;
   forming a second dielectric insulating layer over the oxide liner to surround the dummy portion;

planarizing the second dielectric insulating layer to expose the upper portion of the dummy portion; and, removing the organic dielectric layer to form a dual damascene opening comprising the oxide liner lining trench line portion sidewalls.

2. The method of claim 1, wherein the first and second dielectric insulating layers are selected from the group consisting of organo-silicate glass (OSG), fluorinated silicate glass (FSG), and carbon doped silicon oxide.

3. The method of claim 1, wherein the first and second dielectric insulating layers are formed by precursors selected from the group consisting of organo-silanes and organo-siloxanes.

4. The method of claim 1, wherein the first and second dielectric insulating layers comprise a porous structure having a porous volume of from about 20 to about 60 volume percent with respect to a dielectric insulating layer volume.

5. The method of claim 1, wherein the organic dielectric layer is selected from the group consisting of SILK, FLARE, benzocyclobutene, Nautilus, Teflon, Parylene-F, amorphous fluorocarbon, polyimide, and fluorinated polyimide.

6. The method of claim 1, wherein the hardmask layer is selected from the group consisting of silicon oxycarbide and silicon oxynitride.

7. The method of claim 1, wherein the oxide liner comprises silicon oxide.

8. The method of claim 1, wherein the oxide liner is formed of TEOS oxide.

9. The method of claim 1, wherein the step of planarizing comprises depositing an overlying spin-on polymer followed by a plasma etch back process.

10. The method of claim 1, wherein the step of removing the organic dielectric layer comprises at least one of an oxygen ashing process and a wet stripping process.

11. The method of claim 1, further comprising the steps of:

etching through an etch stop layer at the bottom of the via portion of the dual damascene opening to expose an underlying conductive area;

blanket depositing a barrier layer to line the dual damascene opening selected from the group consisting of Ta, Ti, W, TaN, TiN, WN, TaSiN, TiSiN, and WSiN; and, backfilling the dual damascene opening with a metal selected from the group consisting of copper, aluminum, tungsten, and alloys thereof.

12. The method of claim 11, wherein the metal consists essentially of copper and alloys thereof.

13. The method of claim 12, wherein the barrier layer is selected from the group consisting of Ta, TaN, and TaSiN.

14. A method for forming a dual damascene to avoid etching damage to porous low-K IMD layers comprising the steps of:

providing a first porous low-K IMD layer comprising a via opening overlying an etch stop layer;

forming an organic dielectric layer over the first porous low-K IMD layer to include filling the via opening;

forming a hardmask layer over the organic dielectric layer;

photolithographically patterning and dry etching the hardmask layer and organic dielectric layer to leave a dummy portion overlying the via opening;

forming a silicon oxide liner over the dummy portion;

forming a second porous low-K IMD layer over the oxide liner to surround the dummy portion;

planarizing the second porous low-K IMD layer to expose the upper portion of the dummy portion; and, removing the organic dielectric layer to form a dual damascene opening comprising the silicon oxide liner lining trench line portion sidewalls.

15. The method of claim 14, wherein the first and second porous low-K IMD layers are selected from the group consisting of organo-silicate glass (OSG), fluorinated silicate glass (FSG), and carbon doped silicon oxide.

16. The method of claim 14, wherein the first and second porous low-K IMD layers are formed by precursors selected from the group consisting of organo-silanes and organo-siloxanes.

17. The method of claim 14, wherein the first and second porous low-K IMD layers comprise a porous structure having a porous volume of from about 20 to about 60 volume percent with respect to a dielectric insulating layer volume.

18. The method of claim 14, wherein the organic dielectric layer is selected from the group consisting of SILK, FLARE, benzocyclobutene, Nautilus, Teflon, Parylene-F, amorphous fluorocarbon, polyimide, and fluorinated polyimide.

19. The method of claim 14, wherein the silicon oxide liner is formed of TEOS oxide.

20. The method of claim 14, wherein the hardmask layer is selected from the group consisting of silicon oxycarbide and silicon oxynitride.

21. The method of claim 14, wherein the step of planarizing comprises depositing an overlying spin-on polymer followed by a plasma etch back process.

22. The method of claim 14, wherein the step of removing the organic dielectric layer comprises at least one of an oxygen ashing process and a wet stripping process.

23. The method of claim 14, further comprising the steps of:

etching through the etch stop layer at the bottom of the via portion of the dual damascene opening to expose an underlying conductive area;

blanket depositing a barrier layer to line the dual damascene opening selected from the group consisting of Ta, Ti, W, TaN, TiN, WN, TaSiN, TiSiN, and WSiN; and, backfilling the dual damascene opening with a metal selected from the group consisting of copper, aluminum, tungsten, and alloys thereof.

24. The method of claim 23, wherein the metal consists essentially of copper and alloys thereof.

25. The method of claim 24, wherein the barrier layer is selected from the group consisting of Ta, TaN, and TaSiN.

26. The method of claim 1 further comprising, prior to said photolithographically patterning and dry etching step, the steps of forming a hardmask layer over the organic dielectric layer and patterning and dry etching the hardmask layer.

* * * * *